United States Patent
Huhtasalo et al.

(10) Patent No.: US 7,682,871 B2
(45) Date of Patent: Mar. 23, 2010

(54) METHOD FOR FORMING A JOINT

(75) Inventors: Lauri Huhtasalo, Vantaa (FI); Juuso Järvinen, Tampere (FI); Tero Koivisto, Iltasmäki (FI); Samuli Strömberg, Tampere (FI)

(73) Assignee: UPM Raflatac Oy, Tampere (FI)

( * ) Notice: Subject to any disclaimer, the term of this patent is extended or adjusted under 35 U.S.C. 154(b) by 148 days.

(21) Appl. No.: 10/559,243

(22) PCT Filed: Jun. 1, 2004

(86) PCT No.: PCT/FI2004/000332

§ 371 (c)(1),
(2), (4) Date: Oct. 25, 2006

(87) PCT Pub. No.: WO2004/110119

PCT Pub. Date: Dec. 16, 2004

(65) Prior Publication Data

US 2007/0105361 A1    May 10, 2007

(30) Foreign Application Priority Data

Jun. 4, 2003    (FI) .................................. 20030833

(51) Int. Cl.
*H01L 21/00* (2006.01)
*H01L 21/30* (2006.01)

(52) U.S. Cl. ............. 438/108; 438/118; 438/119; 438/455; 257/E21.505

(58) Field of Classification Search ......... 438/106–108, 438/118, 259
See application file for complete search history.

(56) References Cited

U.S. PATENT DOCUMENTS

| | | | |
|---|---|---|---|
| 6,951,596 B2 * | 10/2005 | Green et al. | 156/264 |
| 2002/0053735 A1 * | 5/2002 | Neuhaus et al. | 257/728 |
| 2002/0072151 A1 | 6/2002 | Amami et al. | |
| 2004/0125040 A1 * | 7/2004 | Ferguson et al. | 343/895 |

FOREIGN PATENT DOCUMENTS

| | | |
|---|---|---|
| DE | 10151657 C1 | 2/2003 |
| EP | 0954208 A1 | 11/1999 |
| EP | 1126517 A2 | 8/2001 |
| WO | WO 0249093 A1 | 6/2002 |
| WO | WO 03056509 A1 | 7/2003 |

* cited by examiner

*Primary Examiner*—Hsien-ming Lee
*Assistant Examiner*—Kevin Parendo
(74) *Attorney, Agent, or Firm*—Venable LLP; Eric J. Franklin

(57) ABSTRACT

A method for forming a joint. A module is introduced including a paper or plastic substrate, an integrated circuit on a chip mounted on the substrate and in electrical contact with contact areas of the module being located on the surface of the substrate. A web is introduced including one circuitry pattern after another provided with contact areas of the circuitry pattern. Settable isotropically conductive adhesive is dispensed on the contact areas of the circuitry pattern. The contact areas of the module are attached to the contact areas of the circuitry pattern by the isotropically conductive adhesive. The isotropically conductive adhesive is cured at the ambient atmospheric pressure. Settable nonconductive adhesive is dispensed at the side of the module in such a manner that the adhesive is sucked underneath the module by capillary forces. The nonconductive adhesive is cured at the ambient atmospheric pressure.

4 Claims, 3 Drawing Sheets

METHOD FOR FORMING A JOINT

CROSS-REFERENCE TO RELATED APPLICATIONS

This application claims priority under 35 USC §119 to Finnish patent application no. 20030833 filed on 4 Jun. 2003 and is the national phase application of PCT/FI2004/000332 under 35 U.S.C. §371.

FIELD OF THE INVENTION

The present invention relates to a method for forming a joint between a module comprising a chip and a substrate comprising a circuitry pattern in such a manner that an electrical connection is formed between the chip and the circuitry pattern by connecting contact areas of the module and contact areas of the circuitry pattern, and the module is attached to the substrate substantially entirely.

BACKGROUND OF THE INVENTION

The present invention relates to a method for forming a joint between a module comprising a chip and a substrate comprising a circuitry pattern in such a manner that an electrical connection is formed between the chip and the circuitry pattern by connecting contact areas of the module and contact areas of the circuitry pattern, and the module is attached to the substrate substantially entirely.

Known adhesive joints are often formed by using one of the following adhesives:

anisotropically conductive adhesive (ACA) is the most common adhesive used for this purpose. It is often used as a paste or a film. ACA requires high temperatures for curing (temperatures around 180° are typical). Also pressure is required when a chip is attached to its substrate because ACA starts to conduct electricity after pressure is applied to the joint. The use of pressure is problematic because during the pressure treatment a continuous process has to be stopped, which limits the capacity of the production line. Typical standstill period may be for example 8 seconds at a time. ACA contains dispersed conductive particles, which size distribution is narrow. The particles have a specific shape and size. The above-mentioned matters make ACA rather expensive.

isotropically conductive adhesive (ICA) typically contains silver particles, which make the adhesive electrically conductive. ICA conducts electricity in all directions, which makes it unsuitable material for joints, which have contact points near each other. A chip can be attached to ICA without using any pressure, which makes possible continuous manufacturing without any standstills. Thus production capacity is good with this adhesive. Further, ICA is much cheaper than ACA.

nonconductive adhesive (NCA) is quite cheap because there are no conductive particles inside the adhesive. The problem related to its use is that the surface to which it is applied requires a pretreatment step because otherwise no proper electrical conductivity through the joint is achieved.

Further, in connection with methods in which an elongated module comprising a chip is attached to a circuitry pattern, is known a method called crimping. The crimping method comprises a pressure impact, which is directed to the ends of the elongated module in order to electrically connect the module and the circuitry pattern.

Publication WO 02/49093 discloses a method for attaching a module comprising a chip to a substrate comprising a circuitry pattern. The module is adhered to the substrate by using a thermoplastic material, which can be either anisotropically conductive or nonconductive.

Publication WO 03/56509 also discloses a method for attaching a module comprising a chip to a substrate comprising a circuitry pattern. The module is adhered to the substrate by using a thermoplastic film. An electrical contact between a contact point of the circuitry pattern and a contact point of the chip is obtained by pressing the contact points together/close enough mechanically.

In spite of advantageous effects achieved by the above-mentioned methods for attaching modules, several drawbacks still exist. Anisotropically conductive thermoplastic material is quite expensive. Nonconductive thermoplastic material is cheaper but electrical contacts formed between the chip and the circuitry pattern are unreliable. The combination of a thermoplastic film and mechanical pressing leads to a reliable joint but as with all the prior methods described above, excess process steps are required for the attachment of the thermoplastic material prior to that process step in which the module is adhered to the substrate.

SUMMARY OF THE INVENTION

The method of the invention is characterized in that the electrical connection is formed by isotropically conductive adhesive or by pressing mechanically, and the rest of the module is attached to the substrate by settable nonconductive adhesive.

By the method of the invention is achieved a reliable joint for which no prefabricating is required as much as with joints, which are formed by using only thermoplastic materials. The nonconductive adhesive, which is merely used for attaching the module and the substrate properly together, can be dispensed without prior time-consuming preparations. Further, the hardening step, which must be accomplished with settable adhesives and requires time, can be transferred at least partly outside the process line when time is saved and thus the production capacity and speed increases. The method also enables use of cheap substrate materials and adhesives.

The purpose of the joint is to electrically connect separate elements, such as an antenna and an integrated circuit on a chip. By the method of the invention a firm joint is achieved because the mechanical strength of the joint can be increased by the nonconductive adhesive. The method of the invention offers great possibilities to reel-to-reel processes.

The joint described in this application relates to manufacturing of transponders, which comprise a circuitry pattern and an integrated circuit on a chip. The circuitry pattern, which forms an antenna of the transponder, is formed on a substrate, and typically it is of copper. The antenna can be a coil-type antenna, or an antenna based on the dipole antenna technique. The substrate can be in a web form, or in a sheeted form. The preferred form is the web form. The web comprises successive and/or adjacent circuitry patterns, which can be processed continuously.

In a ready transponder the chip is electrically connected to the circuitry pattern via a module, which comprises the chip and required electrical leads on a substrate, and is attached to the substrate, which includes the circuitry pattern. The modules are separated from a sheet or a web, and the modules are attached to the circuitry patterns by the method of the invention.

The adhesives described in this application are generally in a liquid or gel form. The adhesives are almost always settable, in other words, they can be cured by suitable means, such as heat, UV radiation or electron beams (EB). In addition to above-mentioned choices, the curing step can be accelerated by activators (such as some metallic components), varied frequency microwaves, moisture, or a chemical reaction, which starts in the adhesive in a predetermined manner.

There are five main embodiments concerning the method of the invention. The first three embodiments deal with a combination of two adhesives, the last two embodiments deal with a combination of a crimping joint and adhesive. The settable isotropically conductive adhesives are in the first three embodiments preferably thermosetting adhesives.

In the first embodiment is used isotropically conductive adhesive, which curing temperature is between 20 and 180° C. The curing time depends on the curing temperature; the higher the temperature is, the shorter the curing time is. In the second and the third embodiments are used isotropically conductive adhesive, which curing temperature is low and curing time long. The beginning of the process is the same in all three embodiments. The isotropically conductive adhesive in a liquid form is applied on the contact area of the substrate (the first contact area). In the first and the second embodiments the module is attached to the adhesive in such a manner that the contact areas of the module (the second contact area) are electrically connected to the contact area of the substrate. The both contact areas comprise a suitable number of contact pads, typically two. In practice, it is necessary to dispense a drop of the isotropically conductive adhesive per each contact pad because contact pads on the same contact area cannot be in electrical contact with each other; Otherwise the functioning of the electrical circuit is disturbed. The third embodiment differs from the other two in that that also nonconductive adhesive is applied before attaching the module.

In the first embodiment, the isotropically conductive adhesive is cured, and after that a drop of the nonconductive adhesive having a low viscosity is dispensed at the side of the module in such a manner that the nonconductive adhesive is sucked underneath the module by capillary forces. The nonconductive adhesive is then cured by a suitable method, such as UV or EB. The nonconductive adhesive spreads under the module, and thus an even adhesive layer, which fills the whole space underneath the module, is formed. The strength of the joint of the invention is very good. On the one hand, if the nonconductive adhesive resists the temperature of the curing process of the isotropically conductive adhesive then it is possible to dispense both adhesives sequentially, and cure the both adhesives at the same time. On the other hand, the nonconductive adhesive does not have to resist the curing temperature of the isotropically conductive adhesive because it can be dispensed after the curing step of the isotropically conductive adhesive, and thus nonconductive adhesives having poor temperature resistance can be used.

In the second and the third embodiment, the nonconductive adhesive is dispensed and cured before the isotropically conductive adhesive is cured. As a consequence, the non-cured isotropically conductive adhesive is surrounded by the cured nonconductive adhesive, and hence it is not significant whether the isotropically conductive adhesive is cured. Especially in these two embodiments it is possible to achieve a lot of advantages offered by the method of the invention. The isotropically conductive adhesive can be cured gradually in the course of time, for example in a storage room. In these embodiments, very low temperatures are sufficient for forming the joint. The used temperature can vary between 18° C. and 70° C., and thus low-cost substrate materials such as polyethylene or polypropylene can be used.

The isotropically conductive adhesive may require heating to a temperature, which is lower than the curing temperature of the adhesive because it may be necessary to evaporate solvents before attaching the module comprising the chip.

In the fourth and the fifth embodiment instead of the adhesive, the electrical connection between the chip and the circuitry pattern is made by crimping, i.e. by a mechanical pressing technique. The contact areas of the circuitry pattern and the module are connected by exerting pressure to the contact areas. Between the contact areas is applied non-conductive adhesive, which is cured by a suitable technique, such as UV radiation, EB (electron beam) radiation, or VFMW (varied frequency microwaves).

In the fourth embodiment the contact areas of the circuitry pattern and the module are first electrically connected by crimping. After that non-conductive adhesive is dispensed adjacent to the module in such a manner that capillary forces draw the adhesive underneath the module. The adhesive is cured and the transponder web is stored. During storing the adhesive reaches its maximum strength.

In the fifth embodiment on the circuitry pattern is dispensed non-conductive adhesive and the module is attached to the circuitry pattern. Thereafter the contact areas of the module and the contact areas of the circuitry pattern are electrically connected by crimping. The curing process can be started immediately after applying the adhesive, even before attaching the module, or after crimping.

In the fifth embodiment some variations are possible. Instead of the circuitry pattern the non-conductive adhesive can be applied on the module on that side of the module, which is intended to be attached to the circuitry pattern.

BRIEF DESCRIPTION OF THE DRAWINGS

In the following, the invention is described by examples and figures in which.

DETAILED DESCRIPTION OF EMBODIMENTS OF THE INVENTION

The method of the invention can be applied for example to the production of a transponder described below and shown in FIG. 1*a*. The transponder comprises an antenna substrate 9 including a circuitry pattern 3, which is in electrical contact with an integrated circuit on a chip, which is located on a module 1. The circuitry pattern 3 can be prepared by etching, electroplating, printing, metallizing, or by combining some of those techniques. The preferred material for the circuitry pattern 3 is copper. The material of the web 1 can be for example polyethylene, polypropylene, polyester, polyvinylchloride, or paper.

Figure 1A:
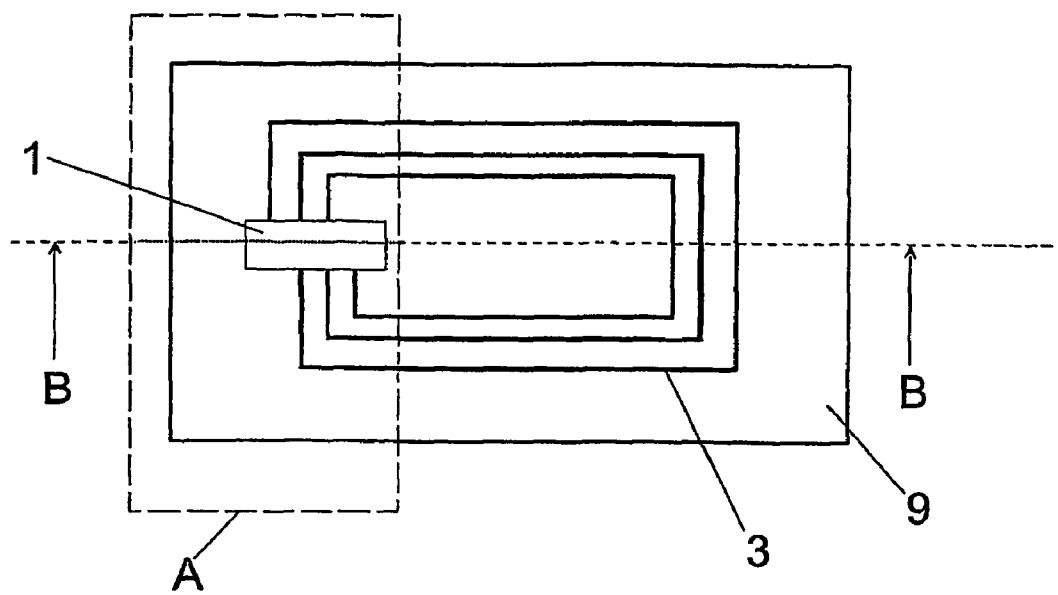
FIG. 1*a* shows in a top view a transponder to which production the method of the invention is applied.
Figure 1B:
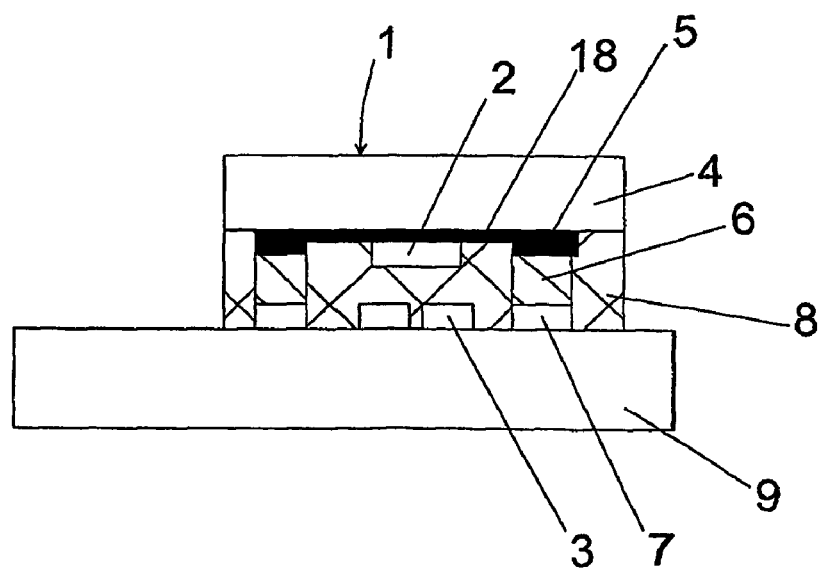
FIG. 1*b* shows an enlargement of the cross section B-B from the area A in the FIG. 1*a,*

FIG. 1*b* shows an enlargement of the cross section BOB from the area A in the FIG. 1*a*. The module 1 comprises a module substrate 4, a chip 2, contact pads 5 of the module and electrical leads 18, which connect electrically the contact pads 5 and the chip 2. The antenna substrate 9 has the circuitry pattern 3 on its surface, and in the ends of the circuitry pattern 3 there are contact pads 7. Isotropically conductive adhesive 6 forms conductive paths between the contact pads 5 and 7, and the rest of the space between the module substrate 4 and the antenna substrate 9 is filled with nonconductive adhesive.

Figure 2:
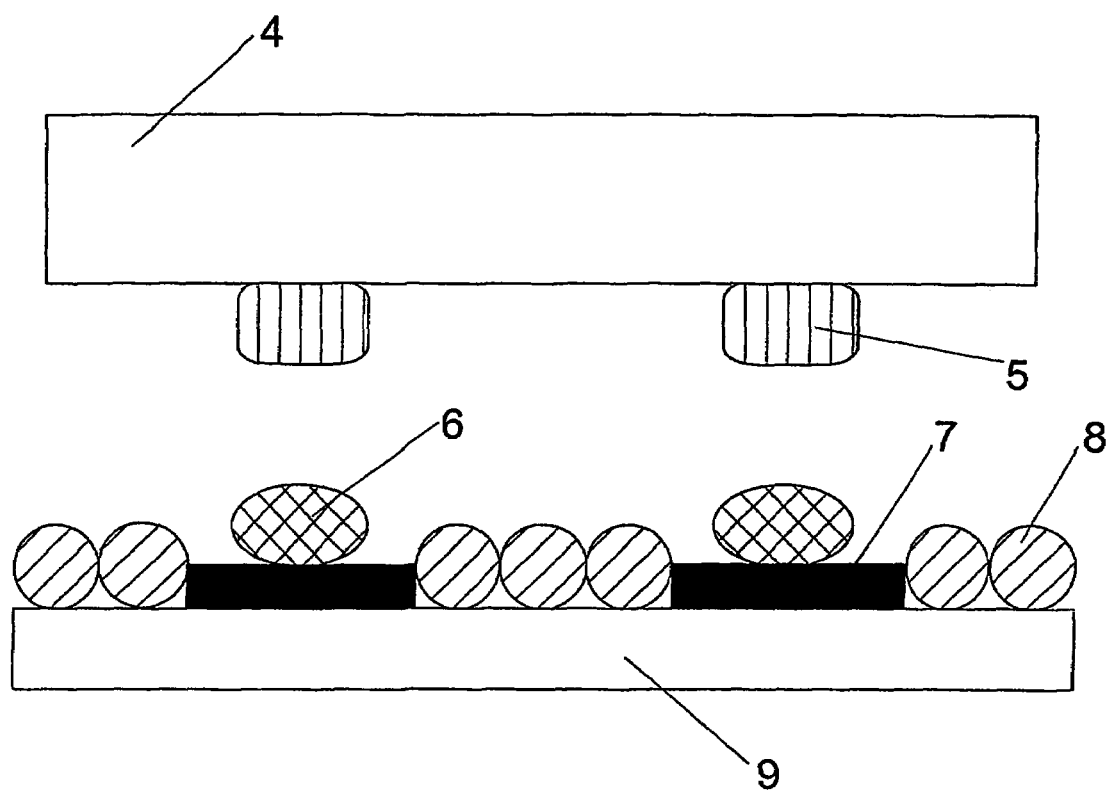
FIG. 2 shows parts forming the joint of the invention in a side view.

FIG. 2 shows parts of the joint of the invention before they are attached to each other. The first part, a module, comprises a module substrate 4, a chip (not shown) and electrically conductive leads (not shown), which form an electrical contact between the chip and contact pads 5 of the module. The second part, an antenna substrate 9 comprising a circuitry pattern and contact pads 7 of the circuitry pattern, is provided with drops of isotropically conductive adhesive 6 on the contact pads 7 and with drops of nonconductive adhesive 8 adjacent to the contact pads 7. When the shown parts are attached to each other the drops of the isotropically conductive adhesive 6 form an electrical contact between the contact pads 5 and 7. The drops of the nonconductive adhesive 8 are spread around the isotropically adhesive, thus preventing electrical conductivity in horizontal direction and giving strength to the joint.

Figure 3:
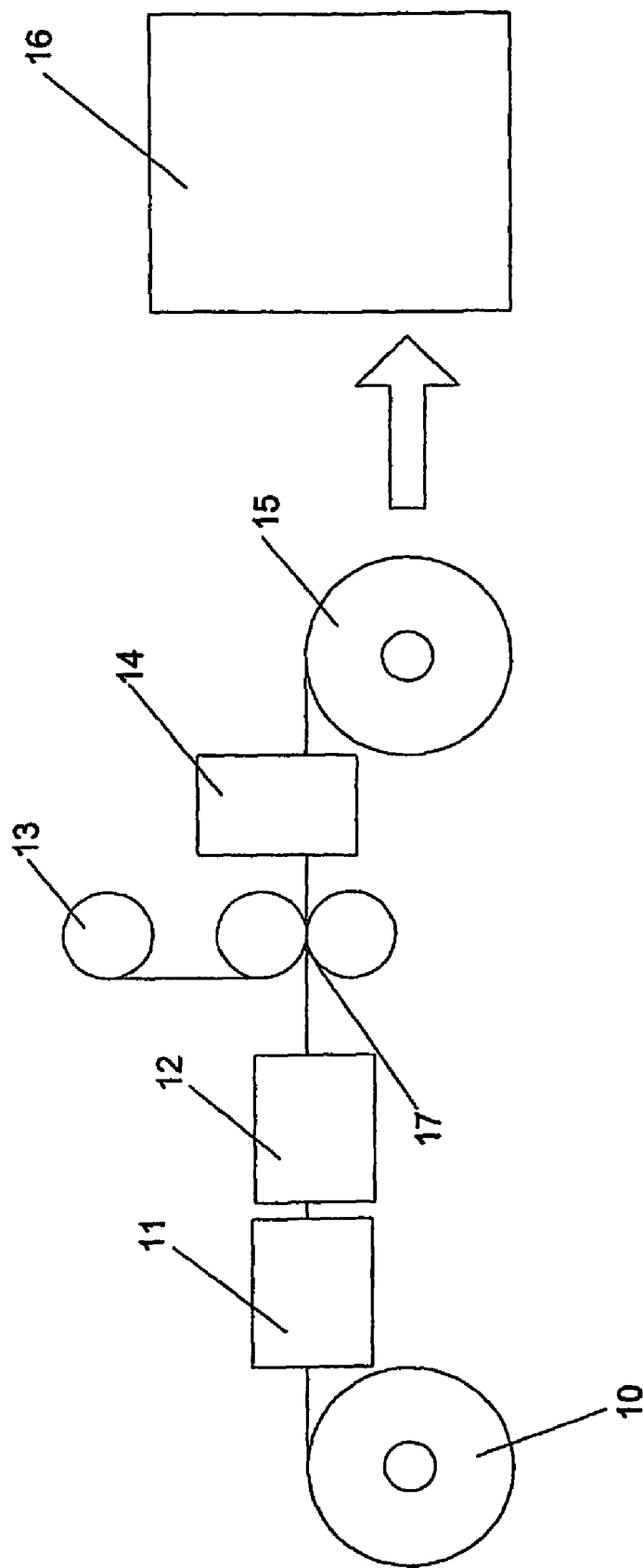
FIG. 3 shows a schematic side view of a production line.

FIG. 3 shows an example of a production line (a reel-to-reel process) on which the joint of the invention can be formed. A reel 10 comprising a continuous first web including successive and/or adjacent circuitry patterns is unwound, and isotropically conductive adhesive is dispensed on the contact pads of the circuitry patterns in a continuous manner in an ICA dispensing unit 11. Nonconductive adhesive is dispensed adjacent to the isotropically adhesive in a NCA dispensing unit 12. A second web comprising modules including chips are unwound from a reel 13, and the modules are released from the second web and attached to the first web in a nip 17. The nonconductive adhesive is cured in a NCA curing unit 14, and the first web is reeled to a reel 15. The reel 15 is transferred to a separate storage area 16 wherein the isotropically conductive adhesive is cured in the course of time. In the storage area, there prevails a low temperature, typically room temperature.

EXAMPLE 1

A web comprising successive and/or adjacent circuitry patterns is brought to a dispensing unit, in which isotropically conductive adhesive is dispensed to a contact area of the web. In the following unit of the process line the module is attached to the adhesive. Thereafter the adhesive is cured in a temperature, which varies between 20 and 180° C. The curing step is quite rapid; typically it takes approximately 25 seconds in a temperature of 150° C. Due to the temperature, the material of the web shall resist such temperatures. Typically the web is of polyester. A major advantage is that no pressure is required in the process, and thus the web advances forward continuously. In such a manner the process line achieves its full capacity. In practice, the curing step can be conducted in a tunnel-like oven.

After the isotropically conductive adhesive has been cured a drop of nonconductive adhesive is dispensed in such a manner that the drop is able to be sucked underneath the module by capillary forces. The nonconductive adhesive surrounds the module at least partially and fills the free space, which is left between the web and the module. The nonconductive adhesive is cured, and a firm joint is achieved. Alternatively, the nonconductive adhesive can be dispensed before the curing step of the isotropically conductive adhesive if the nonconductive adhesive resists temperatures, which are necessary to harden the isotropically conductive adhesive. Then it is possible to cure the both adhesives simultaneously.

EXAMPLE 2

A web comprising successive and/or adjacent circuitry patterns is brought to a dispensing unit, in which isotropically conductive adhesive is dispensed to a contact area on the web. In the following unit of the process line the module is attached to the adhesive. Thereafter a drop of nonconductive adhesive is dispensed in such a manner that the drop is able to be sucked underneath the module by capillary forces. The nonconductive adhesive surrounds the module and fills the free space, which is left between the web and the module. The nonconductive adhesive is hardened without any curing step, or its curing is accelerated by using UV radiation. When the nonconductive adhesive is hardened the web can be reeled up, and transferred to storing wherein the isotropically conductive adhesive is hardened in a course of time in room temperature, or in a slightly elevated temperature. The isotropically conductive adhesive typically hardens in a temperature of 23° C. in 24 hours, in a temperature of 65° C. in 2 hours. The advantages which are described in connection with the second and the third embodiments can be achieved by the above-mentioned process. Manufacturing of the transponder is much more cost-effective because at least the isotopically adhesive can be cured outside the process line.

EXAMPLE 3

A polyester web comprising successive and/or adjacent etched copper circuitry patterns is brought to a dispensing unit, in which isotropically conductive adhesive (for example silver-filled epoxy resin, such as Tra-Duct 2919, Tra-Con, Inc., USA) is dispensed to the web on a contact area. Thereafter drops of nonconductive adhesive (for example photoinitiated ethyl cyanoacrylate adhesive, such as Loctite 4304, Loctite Corporation, USA) are dispensed adjacent to the isotropically conductive adhesive. The viscosity of the mentioned Loctite 4304 is between 15 and 30 cP at a temperature of 25° C. In the following unit of the process line the module is attached to the adhesive. The nonconductive adhesive surrounds the contact pads of the module at least partially and fills the free space, which is left between the web and the module. The nonconductive adhesive is hardened by using UV radiation (1600 mV/cm$^2$, 5 seconds). When the nonconductive adhesive is hardened the web can be reeled up, and transferred to storing wherein the isotropically conductive adhesive is hardened in 24 hours at a room temperature.

EXAMPLE 4

A polyester web comprising successive and/or adjacent etched copper circuitry patterns is brought to a crimping unit, in which first contact areas of circuitry patterns and second contact areas of modules (each comprising a chip) are electrically connected by crimping. Each module and each circuitry pattern have usually two second contact areas and two first contact areas, respectively, and the second contact areas are normally located at the ends of the elongated module. When the contact areas are connected the rest of the module remain unattached. Nonconductive adhesive (for example photoinitiated ethyl cyanoacrylate adhesive, such as Loctite 4304, Loctite Corporation, USA) is dispensed adjacent to the unattached regions of the module from where the nonconductive adhesive is sucked underneath the module by capillary forces. The nonconductive adhesive is hardened by using UV radiation (1600 mV/cm², 5 seconds). When the nonconductive adhesive is treated with the UV light the web can be reeled up, and transferred to storing.

EXAMPLE 5

A polyester web comprising successive and/or adjacent etched copper circuitry patterns is brought to a dispensing unit, in which at least first contact areas of circuitry patterns are covered with non-conductive adhesive (for example photoinitiated ethyl cyanoacrylate adhesive, such as Loctite 4304, Loctite Corporation, USA). Each circuitry pattern has usually two first contact areas between which is some space. It is possible that also that space is covered with the adhesive. The module or at least the second contact areas of the module are attached to the adhesive. Alternatively the adhesive can be applied on the module or at least on the second contact areas of the module. After the module has been attached to the circuitry pattern the first contact areas and the second contact areas are electrically connected by crimping. The nonconductive adhesive is hardened by using UV radiation (1600 mV/cm², 5 seconds). When the nonconductive adhesive is treated with the UV light the web can be reeled up, and transferred to storing.

The above described examples do not restrict the scope of the invention. Many variations of the invention may occur. For example, it may be beneficial in some cases to replace the settable isotropically conductive adhesive with thermoplastic adhesive. The thermoplastic adhesive is naturally also isotropically conductive. The thermoplastic adhesive is applied preferably on a web from which the modules will be separated in a later process step. The melted thermoplastic adhesive is applied on the contact areas of the module and after applying the adhesive crystallizes when it cools. When the module is attached to the circuitry pattern, the isotropically conductive thermoplastic adhesive is melted momentarily in order to form a connection between the contact areas of the module and the contact areas of the circuitry pattern. After that settable nonconductive adhesive is applied by utilizing capillary forces. The nonconductive adhesive is cured in a similar way as described in the above-mentioned embodiments.

The invention claimed is:

1. A method for forming a joint, comprising:
providing a module comprising a paper or plastic substrate, the module further comprising first contact areas located on a surface of the substrate, and the module further comprising an integrated circuit on a chip mounted on the substrate and being in electrical contact with the first contact areas;
providing a web comprising a plurality of adjacent circuitry patterns comprising second contact areas;
dispensing a settable isotropically conductive adhesive on the second contact areas;
attaching the first contact areas to the second contact areas;
dispensing a settable nonconductive adhesive at a side of the module such that the settable nonconductive adhesive is sucked underneath the module by capillary forces;
curing the settable nonconductive adhesive at an ambient atmospheric pressure;
reeling the web up after curing the settable nonconductive adhesive; and
storing the reeled up web for a time and temperature effective to cure the isotropically conductive adhesive at the ambient atmospheric pressure after curing the settable nonconductive adhesive.

2. The method according claim 1, wherein the nonconductive adhesive is cured by applying ultraviolet radiation.

3. A method for forming a joint, comprising:
providing a module comprising a paper or plastic substrate, the module further comprising first contact areas located on a surface of the substrate, and the module further comprising an integrated circuit on a chip mounted on the substrate and being in electrical contact with the first contact areas;
providing a web comprising a plurality of adjacent circuitry patterns comprising second contact areas;
dispensing a settable isotropically conductive adhesive on the second contact areas;
dispensing a settable nonconductive adhesive between the second contact areas;
attaching the first contact areas to the second contact areas;
curing the settable nonconductive adhesive at an ambient atmospheric pressure;
reeling the web up after curing the settable nonconductive adhesive; and
storing the reeled up web for a time and temperature effective to cure the isotropically conductive adhesive at the ambient atmospheric pressure after curing the settable nonconductive adhesive.

4. The method according claim 3, wherein the nonconductive adhesive is cured by applying ultraviolet radiation.

* * * * *